(12) United States Patent
Chen et al.

(10) Patent No.: US 11,112,482 B2
(45) Date of Patent: Sep. 7, 2021

(54) METHOD FOR CALIBRATING VERTICALITY OF PARTICLE BEAM AND SYSTEM APPLIED TO SEMICONDUCTOR FABRICATION PROCESS

(71) Applicant: Yangtze Memory Technologies Co., Ltd., Wuhan (CN)

(72) Inventors: Guangdian Chen, Wuhan (CN); Jin Xing Chen, Wuhan (CN); Zheng Yi Cai, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 91 days.

(21) Appl. No.: 16/709,890

(22) Filed: Dec. 10, 2019

(65) Prior Publication Data

US 2021/0132174 A1    May 6, 2021

Related U.S. Application Data

(63) Continuation of application No. PCT/CN2019/114337, filed on Oct. 30, 2019.

(51) Int. Cl.
| | |
|---|---|
| *G01R 31/00* | (2006.01) |
| *G01R 35/00* | (2006.01) |
| *G01R 31/265* | (2006.01) |
| *H01L 21/67* | (2006.01) |

(52) U.S. Cl.
CPC ....... *G01R 35/005* (2013.01); *G01R 31/2653* (2013.01); *H01L 21/67288* (2013.01)

(58) Field of Classification Search
CPC ............... G01R 31/311; G01R 31/308; G01R 31/2851; G01R 31/2601; G01R 31/26; G01R 1/071; G01R 31/66; G01R 31/307; G01R 31/305; G01R 31/2884; G01R 31/2653

See application file for complete search history.

(56) References Cited

U.S. PATENT DOCUMENTS

| | | | |
|---|---|---|---|
| 8,067,753 B2 | 11/2011 | Touya | |
| 9,915,628 B2 | 3/2018 | Pawlowicz | |
| 2007/0222464 A1* | 9/2007 | Honda | G01R 31/307 324/754.22 |

(Continued)

FOREIGN PATENT DOCUMENTS

| | | |
|---|---|---|
| CN | 101692417 A | 4/2010 |
| CN | 108701576 A | 10/2018 |

(Continued)

*Primary Examiner* — Tung X Nguyen
(74) *Attorney, Agent, or Firm* — Winston Hsu

(57) ABSTRACT

The present invention provides a method for calibrating verticality of a particle beam. The method includes: providing a baseplate having a first sensor and a second sensor; emitting the particle beam to the first sensor of the baseplate from an emitter, such that a first datum is collected when the first sensor receives the particle beam; emitting the particle beam to the second sensor of the baseplate from the emitter, such that a second datum is collected when the second sensor receives the particle beam; calculating a first calibrating datum based on the first datum and the second datum; and adjusting the baseplate or the emitter based on the first calibrating datum if the first calibrating datum is out of a first predetermined range.

18 Claims, 5 Drawing Sheets

(56) References Cited

U.S. PATENT DOCUMENTS

2012/0091339 A1* 4/2012 Ominami ............... H01J 37/28
                                                        250/307
2016/0299103 A1* 10/2016 Saleh ............... H01J 37/32825
2019/0006147 A1   1/2019 Kastrup

FOREIGN PATENT DOCUMENTS

JP   2007-19247 A    1/2007
TW   201227794 A1    7/2012

* cited by examiner

METHOD FOR CALIBRATING VERTICALITY OF PARTICLE BEAM AND SYSTEM APPLIED TO SEMICONDUCTOR FABRICATION PROCESS

CROSS REFERENCE TO RELATED APPLICATIONS

This patent application is a continuation of International Application PCT/CN2019/114337, filed Oct. 30, 2019. The present application is based on and claims priority to International Application PCT/CN2019/114337 filed Oct. 30, 2019, the contents of which are hereby incorporated by reference in their entirety.

BACKGROUND OF THE INVENTION

1. Field of the Invention

The present invention relates to a method for calibrating verticality of a particle beam and a related system, and more particularly to a method for calibrating the vertical relation between a particle beam and a baseplate and a related system.

2. Description of the Prior Art

In the semiconductor fabrication process, particle beams (such as the electron beam) can be utilized for detecting defects on the semiconductor substrate. For example, when an object (such as a wafer) is irradiated by the electron beam, secondary electrons will be generated from the surface structure of the object, and the secondary electrons can be collected and analyzed to obtain a picture of the surface structure, so as to detect the defect on the surface structure of the object. However, if the particle beam is not emitted vertically with respect to a baseplate configured to support the object, the detection may be influenced and the accuracy of the detection is decreased. Thus, the semiconductor fabrication process needs an improvement for the issue mentioned above.

SUMMARY OF THE INVENTION

A technical problem to be solved by the present invention is to provide a method for calibrating verticality of a particle beam and a related system, so as to improve the quality of fabricated semiconductor.

In order to solve the above problem, the present invention provides a method for calibrating verticality of a particle beam. The method includes: providing a baseplate having a first sensor and a second sensor; emitting the particle beam to the first sensor in the baseplate from an emitter, such that a first datum is collected when the first sensor receives the particle beam; emitting the particle beam to the second sensor in the baseplate from the emitter, such that a second datum is collected when the second sensor receives the particle beam; calculating a first calibrating datum based on the first datum and the second datum; and adjusting the baseplate or the emitter based on the first calibrating datum if the first calibrating datum is out of a first predetermined range.

In order to solve the above problem, the present invention further provides a system applied to a semiconductor fabrication process. The system includes an emitter, a baseplate and a processor. The emitter is configured to emit a particle beam. The baseplate includes a plate body, a first sensor and a second sensor. The plate body has a surface. The first sensor and the second sensor are disposed under the surface of the plate body and facing the surface of the plate body, wherein the first sensor and the second sensor are configured to receive the particle beam. The processor is electrically connected to the first sensor, the second sensor and the emitter, wherein the processor is configured to determine a verticality of the particle beam with respect to the surface of the plate body of the baseplate.

The present invention provides a method and a system for calibrating verticality of the particle beam. The verticality of the particle beam may be determined based on the data collected in the sensors of the baseplate, such that the baseplate and/or the emitter can be adjusted based on the data if the progress direction is not vertical to the baseplate. As a result, the quality of product fabricated on the baseplate can be enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
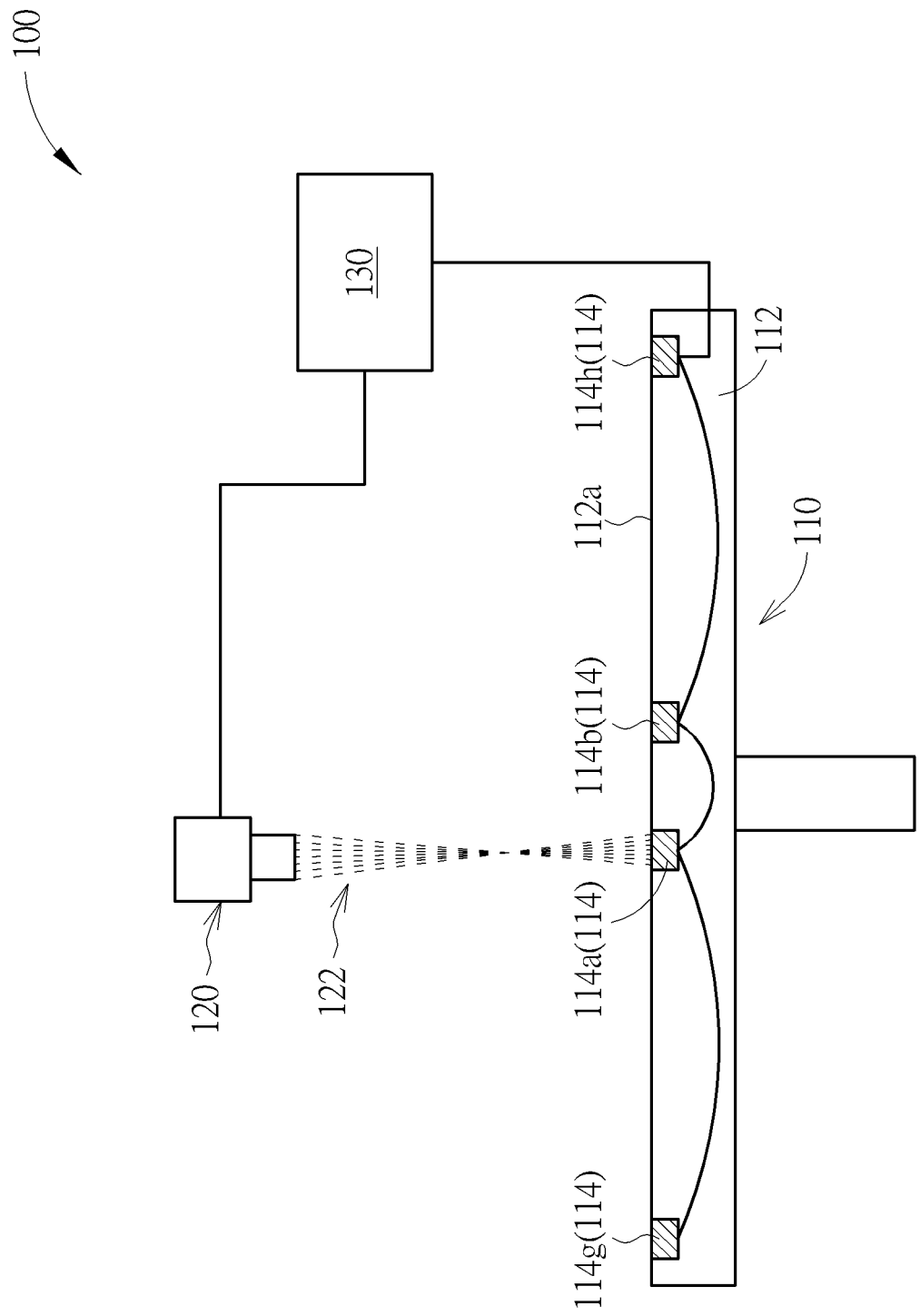
FIG. 1 is a schematic diagram showing a system according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10~30% of the value (e.g., ±10%, ±20%, or ±30% of the value).

Figure 2:
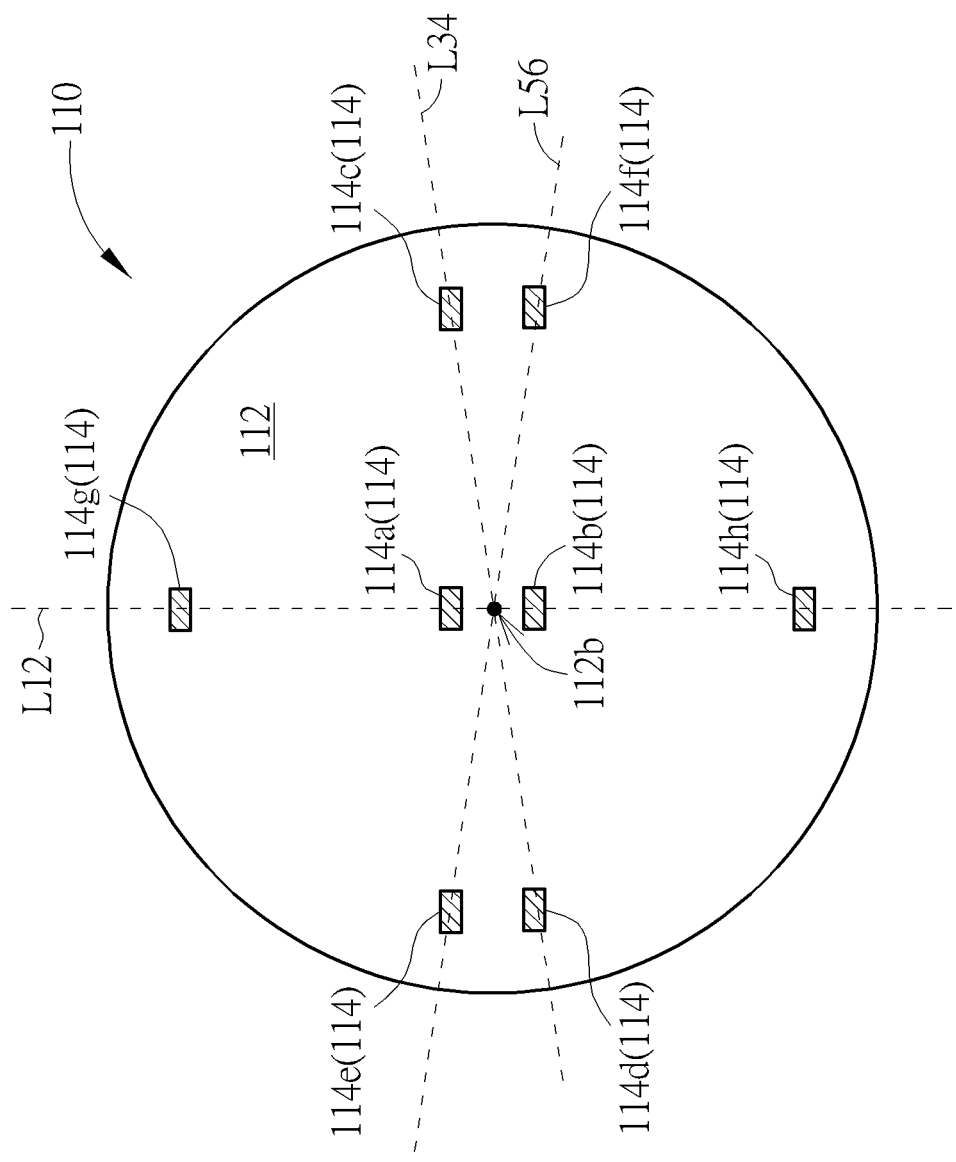
FIG. 2 is a schematic diagram showing a top view of a baseplate according to an embodiment of the present invention.

Referring to FIG. 1 and FIG. 2, FIG. 1 is a schematic diagram showing a system according to an embodiment of the present invention, and FIG. 2 is a schematic diagram showing a top view of a baseplate according to an embodiment of the present invention. Note that the system of this embodiment may be applied to a semiconductor fabrication process, but not limited thereto. In another embodiment, the system may be applied to any other suitable fabrication process. As shown in FIG. 1 and FIG. 2, the system 100 of this embodiment includes an emitter 120, a baseplate 110 and a processor 130. The emitter 120 is configured to emit a particle beam 122. In this embodiment, the particle beam 122 may include an electron beam, but not limited thereto. In another embodiment, the emitter 120 may include any other suitable particle beam.

In the fabrication process, the baseplate 110 is configured to support an object. In other words, the object is disposed on the baseplate 110, and fabrication processes may be performed on the object to fabricate devices or products. Since the system 100 of this embodiment is applied to the semiconductor fabrication process, the baseplate 110 is configured to support a substrate. For example, the substrate may include a wide array of semiconductor materials (such as silicon, germanium, gallium arsenide, indium phosphide, etc.) or non-conductive material (such as a glass, a plastic, or a sapphire wafer, etc.), but not limited thereto. In some embodiments, the baseplate 110 is configured to support a wafer (such as semiconductor wafer or non-conductive material wafer), but not limited thereto.

In some embodiments, an electronic device such as a 3D memory device may be formed on the substrate in the fabrication process, but not limited thereto. In some embodiments, any other suitable device may be formed on the substrate. Note that, the term "3D memory device" refers to a semiconductor device with vertically-oriented strings of memory cell transistors (i.e., herein as "memory strings") on a laterally-oriented substrate so that the memory strings extend in the vertical direction with respect to the substrate.

The baseplate 110 includes a plate body 112 and a plurality of sensors 114. The plate body 112 has a supporting surface 112a, wherein the supporting surface 112a is a surface closest to the object (e.g. wafer) in the fabrication process when the object is placed on the plate body 112, wherein the supporting surface 112a is directly in contact with the object. The plate body 112 may include any suitable material. For example, the plate body 112 may be formed of one or more rigid material(s), but not limited thereto. The sensors 114 are disposed in the plate body 112. In other words, the sensors 114 are disposed under the supporting surface 112a of the plate body 112 and face the supporting surface 112a of the plate body 112.

As shown in FIG. 1 and FIG. 2, the sensors 114 may include a first sensor 114a and a second sensor 114b. Optionally, the sensors 114 may further include a third sensor 114c, a fourth sensor 114d, a fifth sensor 114e, a sixth sensor 114f, a seventh sensor 114g and an eighth sensor 114h, but not limited thereto. The number of the sensors 114 may be designed based on requirements. As shown in FIG. 2, in top view, the first sensor 114a and the second sensor 114b are symmetric with respect to a center 112b of the baseplate 110, the third sensor 114c and the fourth sensor 114d are symmetric with respect to a center 112b of the baseplate 110, the fifth sensor 114e and the sixth sensor 114f are symmetric with respect to a center 112b of the baseplate 110, and the seventh sensor 114g and the eighth sensor 114h are symmetric with respect to a center 112b of the baseplate 110, but not limited thereto. Also, in FIG. 2, an imaginary connection line L12 determined by the first sensor 114a and the second sensor 114b (or determined by the seventh sensor 114g and the eighth sensor 114h) is not parallel to an imaginary connection line L34 determined by the third sensor 114c and the fourth sensor 114d nor an imaginary connection line L56 determined by the fifth sensor 114e and the sixth sensor 114f, and the imaginary connection line L34 is not parallel to the imaginary connection line L56, but not limited thereto. In addition, the imaginary connection line L12, the imaginary connection line L34, and the imaginary connection L56 are not perpendicular to each other. The arrangement of the sensors 114 may be designed based on requirements.

The sensors 114 are configured to receive the particle beam 122 (i.e. the electron beam in this embodiment). In some embodiments, each of the sensors 114 senses a moment when the sensors 114 receive the particle beam 122 and/or an energy intensity of the particle beam 122, but not limited thereto.

As used herein, the term "verticality" means the perpendicular degree (or normal degree) between an element and the supporting surface 112a of the baseplate 110. Namely, in the following, "verticality of the particle beam" means the perpendicular degree between the particle beam 122 or the progress direction of the particle beam 122 and the supporting surface 112a of the baseplate 110. That is to say, "verticality of the particle beam" represents the vertical relation between the supporting surface 112a of the baseplate 110 and the particle beam 122. Moreover, since the normal direction of the supporting surface 112a of the baseplate 110 is perpendicular to the supporting surface 112a of the baseplate 110, the normal direction of the supporting surface 112a of the baseplate 110 has the greatest verticality.

The processor 130 is configured to determine the verticality of the particle beam 122 with respect to the supporting surface 112a of the baseplate 110. In FIG. 1, the processor 130 is electrically connected to the sensors 114 and the emitter 120, such that the processor 130 may collect data from the sensors 114. In this embodiment, the processor 130 may calculate at least one calibrating datum based on the data collected from the sensors 114, and the calibrating datum is related to the verticality of the particle beam 122. The datum collected from the sensor 114 may include, but not limited to, a transmitting time of the particle beam 122 from the emitter 120 to the sensor 114 and/or an energy intensity of the particle beam 122 received by the sensor 114. The determination of the verticality of the particle beam 122 will be described in the follow content.

Moreover, in this embodiment, the processor 130 may control the emitter 120, such as the position of the emitter 120, the emitting energy of the particle beam 122 and/or any other essential parameter of the emitter 120. Furthermore, the processor 130 may be a device including a calculation function. For instance, the processor 130 may be a computer or an integrated circuit, but not limited thereto.

More precisely, when the processor 130 determines that the progress direction of the particle beam 122 is not perpendicular to the supporting surface 112a of the baseplate 110, the slope of the baseplate 110 and/or the emitting direction of the emitter 120 may be adjusted. In an embodiment, the processor 130 may directly adjust the baseplate 110 and/or the emitter 120, but not limited thereto. In another embodiment, the system 100 may further include an adjusting component electrically connected to the processor 130, and the baseplate 110 and/or the emitter 120 may be adjusted by the adjusting component when the processor 130 determines that the progress direction of the particle beam 122 is not perpendicular to the supporting surface 112a.

Figure 3:
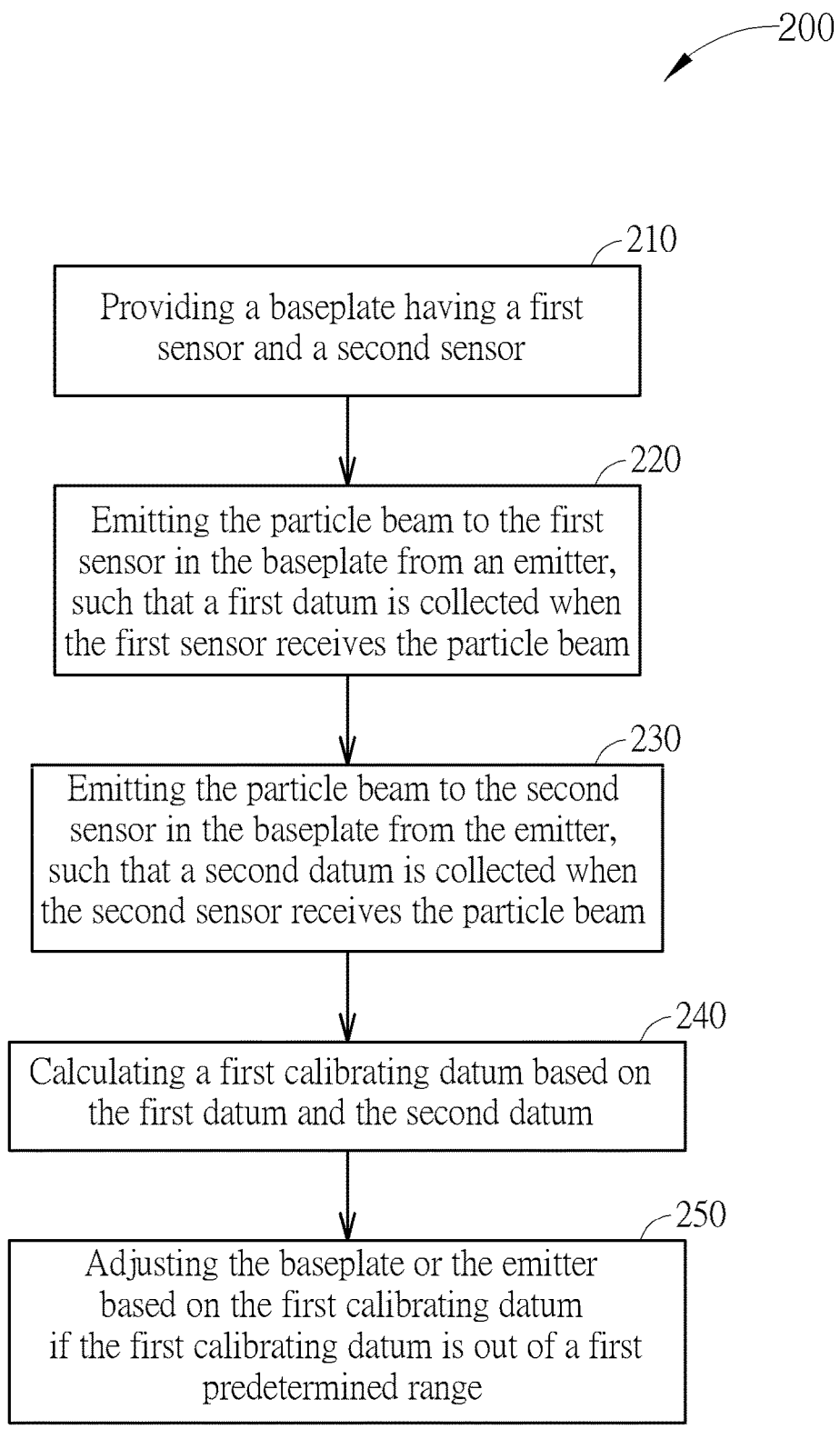
FIG. 3 is a flow diagram showing a method for calibrating verticality of a particle beam according to an embodiment of the present invention.

As shown in FIG. 3, FIG. 3 is a flow diagram showing a method for calibrating verticality of a particle beam according to an embodiment of the present invention. It is to be appreciated that the flow diagram shown in FIG. 3 is exemplary. In some embodiments, some of the steps may be performed simultaneously, or in a different order than shown in FIG. 3. In some embodiments, any other suitable step may be added in the method 200 before or after one of the existing step of the method 200. Regarding the following contents, the method 200 shall be described with reference to FIG. 3. However, the method 200 is not limited to those example embodiments.

Figure 4:
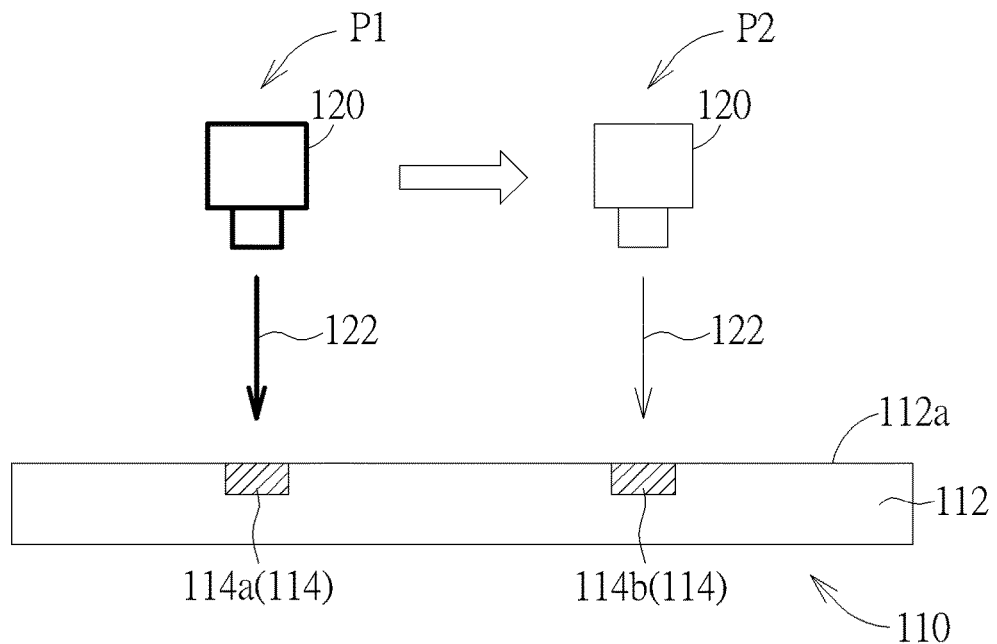
FIG. 4 is a schematic diagram showing a procedure of the calibrating method in a condition according to a first embodiment of the present invention.
Figure 5:
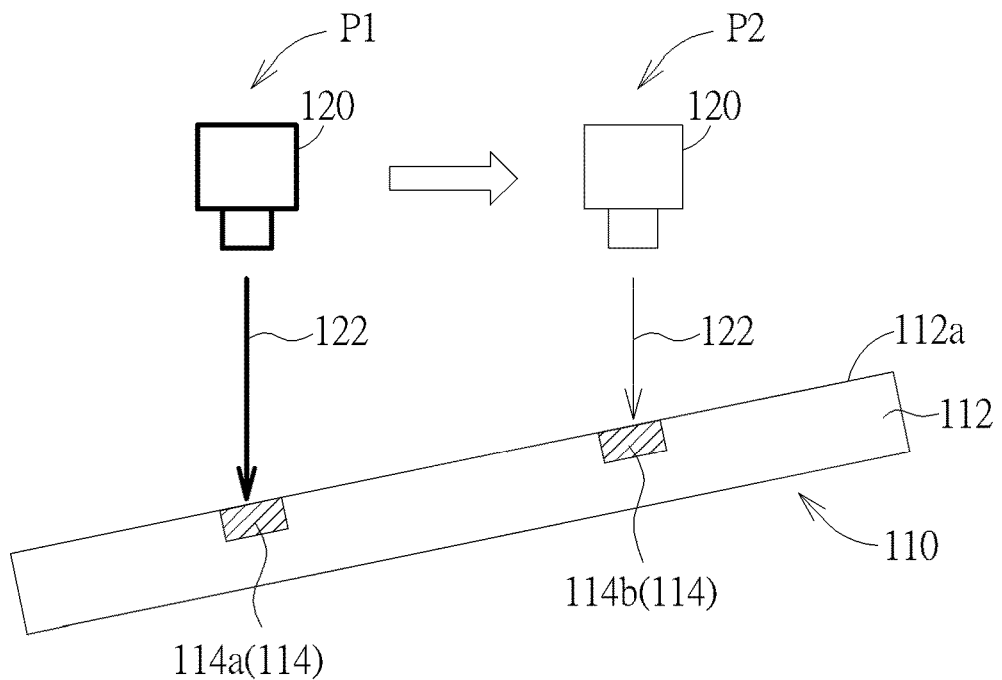
FIG. 5 is a schematic diagram showing a procedure of the calibrating method in another condition according to the first embodiment of the present invention.

In order to explain the method 200 more clearly, FIG. 4 and FIG. 5 are further referred. FIG. 4 is a schematic diagram showing a procedure of the calibrating method in a condition according to a first embodiment of the present invention, and FIG. 5 is a schematic diagram showing a procedure of the calibrating method in another condition according to the first embodiment of the present invention, wherein in FIG. 4 and FIG. 5, only the first sensor 114a and the second sensor 114b among all the sensors 114 are illustrated, so as to make FIG. 4 and FIG. 5 simple and clear. In FIG. 4 and FIG. 5, the calibrating method of the first embodiment is described.

In the step 210, as shown in FIG. 3, the baseplate 110 having sensors 114 is provided, wherein the sensors 114 include the first sensor 114a and the second sensor 114b. The sensors 114 of this embodiment shown in FIG. 2 optionally include the third sensor 114c, the fourth sensor 114d, the fifth sensor 114e, the sixth sensor 114f, the seventh sensor 114g and the eighth sensor 114h, which are not shown in FIG. 4 and FIG. 5.

In the step 220, as shown in FIG. 3, the particle beam 122 is emitted to the first sensor 114a in the baseplate 110 from an emitter 120, such that a first datum is collected when the first sensor 114a receives the particle beam 122, wherein the processor 130 collects the first datum from the first sensor 114a. In the step 230, as shown in FIG. 3, the particle beam 122 is emitted to the second sensor 114b in the baseplate 110 from the emitter 120, such that a second datum is collected when the second sensor 114b receives the particle beam 122, wherein the processor 130 collects the second datum from the second sensor 114b.

As shown in FIG. 4 and FIG. 5, in the step 220, the emitter 120 may be situated at a position P1 (as shown in coarse line in FIG. 4 and FIG. 5) corresponding to the first sensor 114a and emit the particle beam 122 (coarse arrow in FIG. 4 and FIG. 5) to the first sensor 114a correspondingly. When the first sensor 114a receives the particle beam 122, the processor 130 collects the first datum from the first sensor 114a. Then, the emitter 120 may be situated at a position P2 (as shown in fine line in FIG. 4 and FIG. 5) corresponding to the second sensor 114b and emit the particle beam 122 (fine arrow in FIG. 4 and FIG. 5) to the second sensor 114b correspondingly. When the second sensor 114b receives the particle beam 122, the processor 130 collects the second datum from the second sensor 114b. In addition, between the step 220 and step 230, the method 200 further includes a step for moving the emitter 120 from the position P1 corresponding to the first sensor 114a to the position P2 corresponding to the second sensor 114b.

In this embodiment, the first datum may include a transmitting time of the particle beam 122 from the emitter 120 at the position P1 to the first sensor 114a, and the second datum may include a transmitting time of the particle beam 122 from the emitter 120 at the position P2 to the second sensor 114b, but not limited thereto.

Optionally, in this embodiment, the emitter 120 may move to positions respectively corresponding to the third, fourth, fifth, sixth, seventh and eighth sensors 114c-114h, and respectively emit the particle beam 122 to the third, fourth, fifth, sixth, seventh and eighth sensors 114c-114h at the correspondingly positions. Similarly, the processor 130 collects a third datum when the third sensor 114c receives the particle beam 122, the processor 130 collects a fourth datum when the fourth sensor 114d receives the particle beam 122, the processor 130 collects a fifth datum when the fifth sensor 114e receives the particle beam 122, the processor 130 collects a sixth datum when the sixth sensor 114f receives the particle beam 122, the processor 130 collects a seventh datum when the seventh sensor 114g receives the particle beam 122, and the processor 130 collects an eighth datum when the eighth sensor 114h receives the particle beam 122. In this embodiment, each of the data may include a transmitting time of the particle beam 122 from the emitter 120 to the corresponding sensor 114.

Note that the order of sensors 114 emitted by the emitter 120 is not limited in the present invention. In some embodiments, the order may be designed based on the arrangement of the sensors 114, but not limited thereto.

In the step 240, as shown in FIG. 3, a first calibrating datum is calculated based on the first datum and the second datum, wherein the first calibrating datum is calculated by the processor 130. Since the first calibrating datum is related to the verticality of the particle beam 122, and the first sensor 114a and the second sensor 114b determine the imaginary connection line L12, the verticality of the particle beam 122 may be evaluated in a direction parallel to the imaginary connection line L12 by the first calibrating datum.

In this embodiment, since the first datum includes the transmitting time of the particle beam 122 from the emitter 120 to the first sensor 114a, and the second datum includes the transmitting time of the particle beam 122 from the emitter 120 to the second sensor 114b, if two transmitting times respectively included in the first datum and the second datum are equal to or close to each other, the verticality of the particle beam 122 evaluated in the direction parallel to the imaginary connection line L12 is high enough. Contrarily, if the two transmitting times are not equal to or not close to each other, the verticality of the particle beam 122 evaluated in the direction parallel to the imaginary connection line L12 is not high enough, and the quality of product fabricated in this condition may be low.

Regarding the first calibrating datum calculated based on the first datum and the second datum, if the first calibrating datum is in a first predetermined range, the verticality of the particle beam 122 evaluated in the direction parallel to the imaginary connection line L12 is high enough; if the first calibrating datum is out of the first predetermined range, the verticality of the particle beam 122 evaluated in the direction parallel to the imaginary connection line L12 is not high enough. In this embodiment, the first calibrating datum is a difference between the first datum and the second datum, but not limited thereto. In some embodiments, the first predetermined range may range, but is not limited to, from 5% to −a5%, from 1% to −a1%, from 0.5% to −0.5%, from 0.1% to −0.1%, from 0.05% to −0.05% or from 0.01% to −0.01% of the first datum or the second datum. In some embodiments, since the first calibrating datum is the difference of two transmitting times, the first predetermined range may be in a range of two predetermined milliseconds or two predetermined microseconds, but not limited thereto.

In FIG. 4, since two transmitting times respectively included in the first datum and the second datum are equal to or close to each other, the first calibrating datum is in the first predetermined range, and the verticality of the particle beam 122 evaluated in the direction parallel to the imaginary connection line L12 is high enough. In FIG. 5, since the progress direction of the particle beam 122 emitted by the emitter 120 is not perpendicular to the supporting surface 112a of the baseplate 112, the transmitting time included in the first datum may be quite different from the transmitting time included in the second datum. For example, the transmitting time included in the first datum is greater than the transmitting time included in the second datum evidently in FIG. 5, the first calibrating datum is out of the first predetermined range, and the verticality of the particle beam 122 evaluated in the direction parallel to the imaginary connection line L12 is not high enough.

Similarly, in this embodiment, a second calibrating datum can be calculated based on the third datum and the fourth datum, a third calibrating datum can be calculated based on the fifth datum and the sixth datum, and a fourth calibrating datum can be calculated based on the seventh datum and the eighth datum. The verticality of the particle beam 122 may be evaluated in a direction parallel to the imaginary connection line L34 by the second calibrating datum, the verticality of the particle beam 122 may be evaluated in a direction parallel to the imaginary connection line L56 by the third calibrating datum, and the verticality of the particle beam 122 may be evaluated in the direction parallel to the imaginary connection line L12 by the fourth calibrating datum. Since the calculating methods, the evaluating methods and range determining methods (i.e. determining a second predetermined range, a third predetermined range and a fourth predetermined range) of the second calibrating datum, the third calibrating datum and the fourth calibrating datum are similar to the first calibrating datum, these will not be redundantly described.

In the step 250, as shown in FIG. 3, the baseplate 110 or the emitter 120 may be adjusted based on the first calibrating datum if the first calibrating datum is out of the first predetermined range. In other words, when the verticality of the particle beam 122 evaluated in the direction parallel to the imaginary connection line L12 is not high enough, the baseplate 110 or the emitter 120 may be adjusted, so as to enhance the verticality of the particle beam 122. The slope of the baseplate 110 and/or the emitting direction of the emitter 120 may be adjusted by the processor 130 or the additional adjusting component.

In FIG. 4, since the first calibrating datum is in the first predetermined range, the baseplate 110 and the emitter 120 do not need to be adjusted for enhancing the verticality of the particle beam 122 evaluated in the direction parallel to the imaginary connection line L12. In FIG. 5, since the first calibrating datum is out of the first predetermined range, the baseplate 110 and/or the emitter 120 need to be adjusted for enhancing the verticality of the particle beam 122 evaluated in the direction parallel to the imaginary connection line L12.

Similarly, the baseplate 110 and/or the emitter 120 may be adjusted based on the second calibrating datum if the second calibrating datum is out of the second predetermined range, may be adjusted based on the third calibrating datum if the third calibrating datum is out of the third predetermined range, and may be adjusted based on the fourth calibrating datum if the fourth calibrating datum is out of the fourth predetermined range.

In particular, in the method 200 of this embodiment, the verticality of the particle beam 122 may be evaluated in three directions which are respectively parallel to the imaginary connection lines L12, L34, L56. Thus, the verticality of the particle beam 122 may be enhanced more. As the result, after performing the method 200, the particle beam 122 may be substantial perpendicular to the supporting surface 112a of the baseplate 110. In another embodiment, the verticality of the particle beam 122 may be evaluated in two or more than two directions which are not parallel to each other.

In addition, since the first sensor 114a and the second sensor 114b of this embodiment may be symmetric with respect to the center 112b of the baseplate 110, the first calibrating datum calculated based on the first datum and the second datum may explicitly express the verticality of the particle beam 122 in the direction parallel to the imaginary connection line L12. Similarly, the second calibrating datum calculated based on the third datum and the fourth datum may explicitly express the verticality of the particle beam 122 in the direction parallel to the imaginary connection line L34 due to the symmetric relation of the third sensor 114c and the fourth sensor 114d. The present invention is not limited to the above. In another embodiment, the sensors 114 may not symmetric with respect to the center 112b of the baseplate 110.

Figure 6:
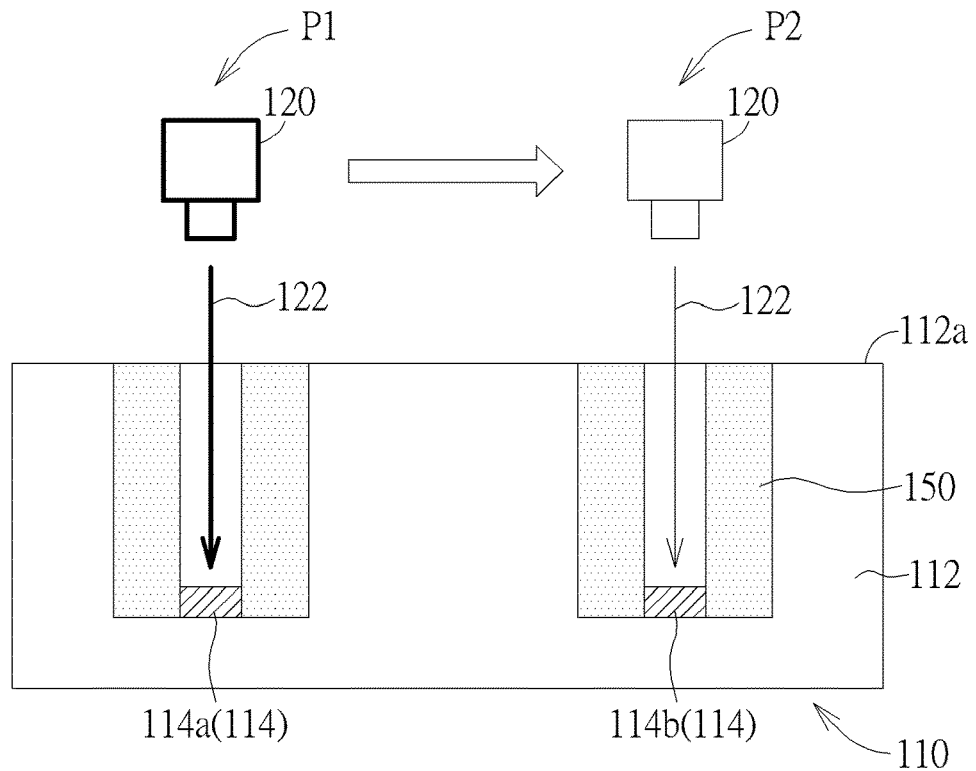
FIG. 6 is a schematic diagram showing a procedure of the calibrating method in a condition according to a second embodiment of the present invention.
Figure 7:
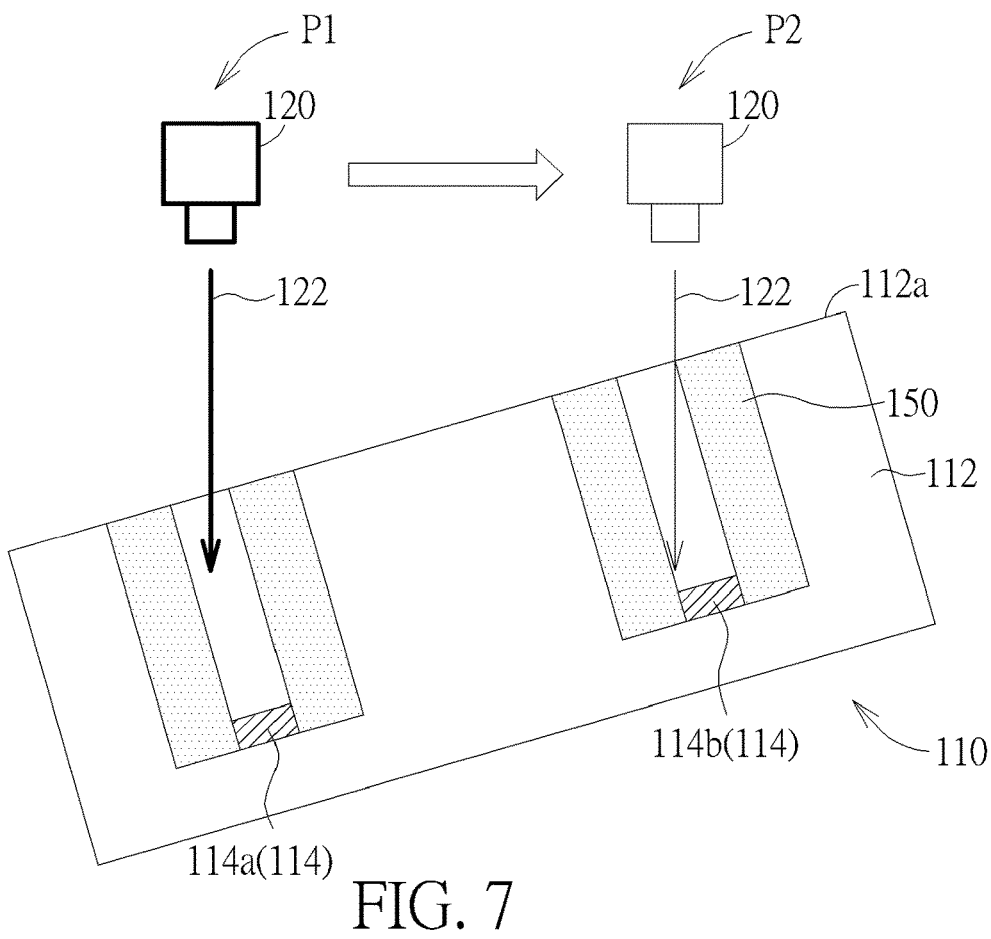
FIG. 7 is a schematic diagram showing a procedure of the calibrating method in another condition according to the second embodiment of the present invention.

Referring to FIG. 6 and FIG. 7, FIG. 6 is a schematic diagram showing a procedure of the calibrating method in a condition according to a second embodiment of the present invention, and FIG. 7 is a schematic diagram showing a procedure of the calibrating method in another condition according to the second embodiment of the present invention, wherein in FIG. 6 and FIG. 7, the sensors are only illustrated the first sensor 114a and the second sensor 114b, so as to make FIG. 6 and FIG. 7 simple and clear. As shown in FIG. 6 and FIG. 7, the calibrating method 200 of the second embodiment is described. The difference between the first embodiment and this embodiment is that the datum collected from the corresponding sensor 114 may include the energy intensity of the particle beam 122 received by the corresponding sensor 114. That is to say, in FIG. 6 and FIG. 7, the first datum may include the energy intensity of the particle beam 122 received by the first sensor 114a, and the second datum may include the energy intensity of the particle beam 122 received by the second sensor 114b.

In this embodiment, if two energy intensities respectively included in the first datum and the second datum are equal to or close to each other, the verticality of the particle beam 122 evaluated in the direction parallel to the imaginary connection line L12 is high enough. In this condition, the first calibrating datum is in the first predetermined range. Contrarily, if two energy intensities are not equal to or not close to each other, the verticality of the particle beam 122 evaluated in the direction parallel to the imaginary connection line L12 is not high enough, and the quality of product fabricated in this condition may be low. In this condition, the first calibrating datum is out of the first predetermined range.

In FIG. 6, since two energy intensities respectively included in the first datum and the second datum are equal to or close to each other, the first calibrating datum is in the first predetermined range, such that the baseplate 110 and the emitter 120 do not need to be adjusted for enhancing the verticality of the particle beam 122 evaluated in the direction parallel to the imaginary connection line L12. In FIG. 7, since the progress direction of the particle beam 122 emitted by the emitter 120 is not perpendicular to the supporting surface 112a of the baseplate 112, the energy intensity included in the first datum may be quite different from the energy intensity included in the second datum. For example, the energy intensity included in the first datum is greater than the energy intensity included in the second datum evidently in FIG. 7, the first calibrating datum is out of the first predetermined range, and the baseplate 110 and/or the emitter 120 need to be adjusted for enhancing the verticality of the particle beam 122 evaluated in the direction parallel to the imaginary connection line L12.

Furthermore, since the particle beam 122 in FIG. 6 illuminates the sensors 114 in the normal incidence way, and the particle beam 122 in FIG. 7 illuminates the sensors 114 in the oblique incidence way, the energy intensities of the first datum and the second datum in FIG. 6 are greater than the energy intensities of the first datum and the second datum in FIG. 7. Accordingly, if the energy intensity is smaller than a predetermined value, the verticality of the particle beam 122 is not high enough.

Moreover, in this embodiment, the sensor 114 may optionally include a collimator 150. Thus, if the particle beam 122 illuminates the sensor 114 in the oblique incidence way (as shown in FIG. 7), the particle beam 122 may be correspondingly blocked by the collimator 150 according to the incidence angle of the particle beam 122 and the position relation between the emitter 120 and the collimator 150, such that the energy intensity received by the sensor 114 may be evidently different based on the incidence angle of the particle beam 122. As the result, the verticality of the particle beam 122 may be accurately detected based on these different data. In another embodiment, the sensor 114 may not include the collimator 150.

In summary, the present invention provides a method and a system for calibrating verticality of the particle beam. The verticality of the particle beam may be determined based on the data collected in the sensors of the baseplate, such that the baseplate and/or the emitter can be adjusted based on the data if the progress direction is not vertical to the baseplate. As a result, the quality of product fabricated on the baseplate can be enhanced.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for calibrating verticality of a particle beam, the method comprising:
   providing a baseplate having a first sensor and a second sensor;
   emitting the particle beam to the first sensor in the baseplate from an emitter, such that a first datum is collected when the first sensor receives the particle beam;
   emitting the particle beam to the second sensor in the baseplate from the emitter, such that a second datum is collected when the second sensor receives the particle beam;
   calculating a first calibrating datum based on the first datum and the second datum; and
   adjusting the baseplate or the emitter based on the first calibrating datum if the first calibrating datum is out of a first predetermined range.

2. The method of claim 1, wherein the first datum comprises a transmitting time of the particle beam from the emitter to the first sensor, and the second datum comprises a transmitting time of the particle beam from the emitter to the second sensor.

3. The method of claim 1, wherein the first datum comprises an energy intensity of the particle beam received by the first sensor, and the second datum comprises an energy intensity of the particle beam received by the second sensor.

4. The method of claim 1, wherein between the step of emitting the particle beam to the first sensor and the step of emitting the particle beam to the second sensor, the method further comprises:
   moving the emitter from a position corresponding to the first sensor to a position corresponding to the second sensor.

5. The method of claim 1, wherein the first calibrating datum is a difference between the first datum and the second datum.

6. The method of claim 1, wherein the first sensor and second sensor are symmetric with respect to a center of the baseplate.

7. The method of claim 1, wherein the baseplate further has a third sensor and a fourth sensor, and the method further comprises:
   emitting the particle beam to the third sensor in the baseplate from the emitter, such that a third datum is collected when the third sensor receives the particle beam;
   emitting the particle beam to the fourth sensor in the baseplate from the emitter, such that a fourth datum is collected when the fourth sensor receives the particle beam; and
   calculating a second calibrating datum based on the third datum and the fourth datum,
   wherein in the step of adjusting the baseplate or the emitter, the baseplate or the emitter is adjusted further based on the second calibrating datum if the second calibrating datum is out of a second predetermined range.

8. The method of claim 7, wherein an imaginary connection line determined by the first sensor and the second sensor is not parallel to an imaginary connection line determined by the third sensor and the fourth sensor.

9. The method of claim 1, wherein the first sensor and the second sensor individually comprise a collimator.

10. The method of claim 1, wherein the baseplate is configured to support a wafer.

11. The method of claim 1, wherein the particle beam comprises an electron beam.

12. A system applied to a semiconductor fabrication process, comprising:
   an emitter configured to emit a particle beam;
   a baseplate comprising:
      a plate body having a surface; and
      a first sensor and a second sensor disposed under the surface of the plate body and facing the surface of the plate body, wherein the first sensor and the second sensor are configured to receive the particle beam; and
   a processor electrically connected to the first sensor, the second sensor and the emitter, wherein the processor is configured to determine a verticality of the particle beam with respect to the surface of the plate body of the baseplate.

13. The system of claim 12, wherein the first sensor and the second sensor are symmetric with respect to a center of the baseplate.

14. The system of claim 13, wherein the baseplate further comprises a third sensor and a fourth sensor disposed under the surface of the plate body and facing the surface of the plate body, wherein the third sensor and the fourth sensor are symmetric with respect to the center of the baseplate.

15. The system of claim 14, wherein an imaginary connection line determined by the first sensor and the second sensor is not parallel to an imaginary connection line determined by the third sensor and the fourth sensor.

16. The system of claim 12, wherein the first sensor and the second sensor individually comprise a collimator.

17. The system of claim 12, wherein the baseplate is configured to support a wafer.

18. The system of claim 12, wherein the particle beam comprises an electron beam.

* * * * *